United States Patent
Uemura et al.

(10) Patent No.: US 8,749,287 B2
(45) Date of Patent: Jun. 10, 2014

(54) SEMICONDUCTOR DEVICE

(75) Inventors: Taiki Uemura, Kawasaki (JP);
Yoshiharu Tosaka, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 950 days.

(21) Appl. No.: 12/848,300

(22) Filed: Aug. 2, 2010

(65) Prior Publication Data

US 2010/0308881 A1    Dec. 9, 2010

Related U.S. Application Data

(62) Division of application No. 12/254,237, filed on Oct. 20, 2008, now abandoned.

(30) Foreign Application Priority Data

Nov. 8, 2007    (JP) ................................. 2007-291181

(51) Int. Cl.
*H03K 3/289* (2006.01)
*H03K 3/3562* (2006.01)

(52) U.S. Cl.
CPC .................................. *H03K 3/35625* (2013.01)
USPC ........................................................ 327/203

(58) Field of Classification Search
USPC .......... 327/199–203, 208–212, 214, 215, 218
See application file for complete search history.

(56) References Cited

U.S. PATENT DOCUMENTS

| 5,081,377 A | 1/1992 | Freyman |
| 6,753,714 B2 | 6/2004 | Gupta |
| 6,864,733 B2 | 3/2005 | Anshumali et al. |
| 7,492,202 B2 * | 2/2009 | Inoue ............................ 327/203 |
| 7,616,040 B2 | 11/2009 | Motomura |
| 2004/0007743 A1 | 1/2004 | Matsuda et al. |
| 2005/0141265 A1 | 6/2005 | Yokoyama |
| 2008/0258789 A1 * | 10/2008 | Motomura ..................... 327/202 |

FOREIGN PATENT DOCUMENTS

| JP | 04-216212 A | 8/1992 |
| JP | 04-227112 A | 8/1992 |
| JP | 04-258012 A | 9/1992 |

OTHER PUBLICATIONS

Notice of Reasons for Rejection date Dec. 20, 2011, issued in corresponding Japanese Patent Application No. 2007-291181.

* cited by examiner

*Primary Examiner* — Sibin Chen
(74) *Attorney, Agent, or Firm* — Westerman, Hattori, Daniels & Adrian, LLP (57) ABSTRACT

A semiconductor device has a first latch circuit, a second latch circuit configured to receive an output of the first latch circuit, a first switching element provided between the first latch circuit and the second latch circuit, a feedback line for feeding data held by the second latch circuit to the first latch circuit, and a second switching element provided on the feedback line.

4 Claims, 12 Drawing Sheets

SEMICONDUCTOR DEVICE

CROSS-REFERENCE TO RELATED APPLICATIONS

This application is a divisional application of U.S. Ser. No. 12/254,237, filed Oct. 20, 2008, which is based upon and claims the benefit of priority from the prior Japanese Patent Application No. 2007-291181, filed on Nov. 8, 2007, the entire content of which is incorporated herein by reference.

BACKGROUND

The present invention relates to semiconductor devices.

Unlike a hard error which is permanent destruction of a specific portion of a circuit, a soft error is a recoverable fleeting malfunction which occurs in a semiconductor chip. The soft error is caused by incidence of a neutron ray among secondary cosmic rays, an alpha ray from the packaging material of a Large Scale Integration (LSI), or a like ray on the LSI.

Various countermeasures against the soft error are devised. One effective and general countermeasure is a method of designing a circuit which prevents a system from being affected by such an error. For example, an Error Correction Code (ECC) circuit is capable of correcting an error. Such countermeasures are accompanied by an increase in the area of an LSI and are not applicable to every logic circuit.

Figure 1:
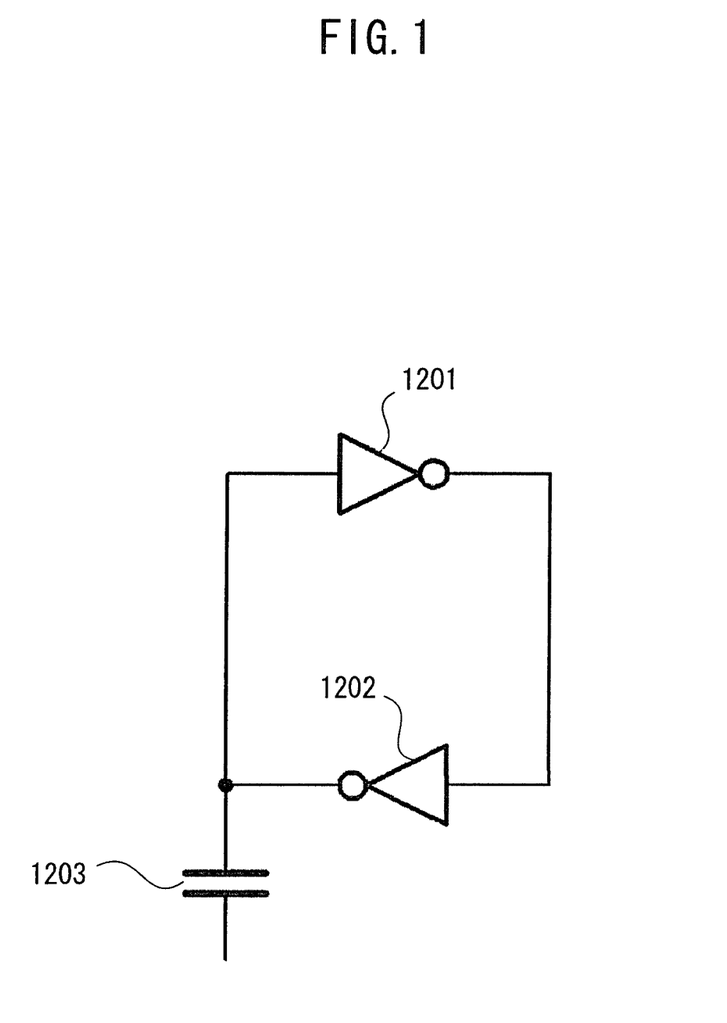
FIG. 1 is a circuit diagram showing a latch circuit.

FIG. 1 shows other soft error avoiding means. A capacitor 1203 is added to a data holding node of a latch circuit having inverters 1201 and 1202 in order to suppress data inversion caused by occurrence of electric charge due to radiation. This case results in performance degradations including prolonged setup time and delay time.

Another known technique is a master-slave flip-flop circuit as described below. The master-slave flip-flop circuit includes a master-side closed loop circuit including a first switching element configured to perform data input control, a plurality of semiconductor elements, and second and third switching elements configured to control the holding of input data inputted through the first switching element, and a slave-side closed loop circuit including a plurality of semiconductor elements inclusive of some of the semiconductor elements, and a fourth switching element configured to control the holding of the input data.

Yet another known technique is an inverter as described below. The inverter has a doubled structure wherein a first p-channel metal oxide semiconductor (MOS) transistor and a first n-channel MOS transistor are coupled in series with a source or drain line in this order from a node coupled to a first voltage source side toward a node coupled to a second voltage source side; and a second MOS transistor which is gate-to-gate coupled to at least one of the first p-channel MOS transistor and the first n-channel MOS transistor and which has the same conductivity type channel as that transistor is further coupled in series with the source or drain line.

SUMMARY

According to an aspect of the invention, a semiconductor device has a first latch circuit, a second latch circuit configured to receive an output of the first latch circuit, a first switching element provided between the first latch circuit and the second latch circuit, a feedback line for feeding data held by the second latch circuit to the first latch circuit, and a second switching element provided on the feedback line.

PREFERRED EMBODIMENT

Figure 2A:
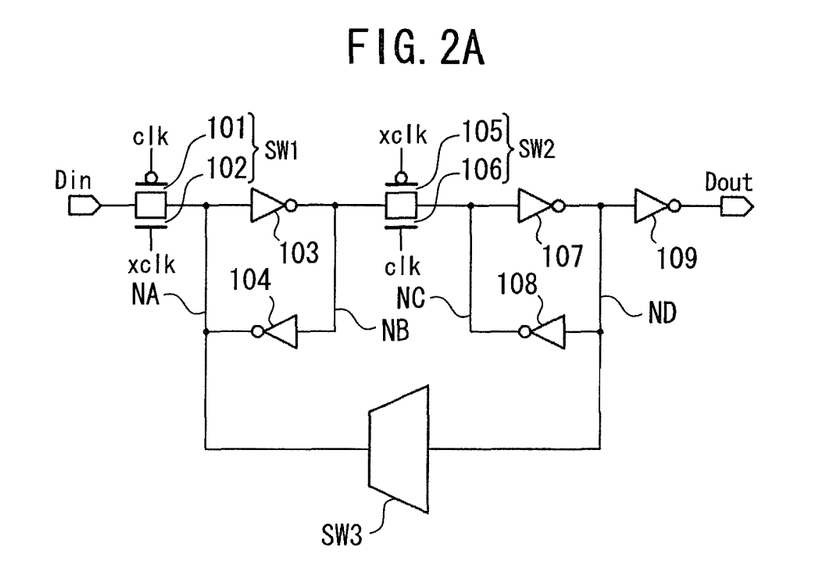
FIGS. 2A to 2E are circuit diagrams showing a semiconductor device having a latch circuit according to a first embodiment.

FIG. 2A shows a semiconductor device having a latch circuit according to a first embodiment. Hereinafter, a MOS field effect transistor will be referred to as a "transistor". A switching element SW1 includes, for example, a p-channel transistor 101 and an n-channel transistor 102. The p-channel transistor 101 has a gate coupled to a signal line for clock signal clk, and source and drain coupled to a data input terminal Din and a data holding node NA. The n-channel transistor 102 has a gate coupled to a signal line for clock signal xclk, and source and drain coupled to the data input terminal Din and the data holding node NA. The clock signals clk and xclk are signals inverted from each other.

An inverter 103 has an input terminal coupled to the data holding node NA, and an output terminal coupled to a data holding node NB. An inverter 104 has an input terminal coupled to the data holding node NB, and an output terminal coupled to the data holding node NA. The inverters 103 and 104 function as a master latch circuit. The data holding node NA of the master latch circuit interconnects the input terminal of the inverter 103 and the output terminal of the inverter 104. The data holding node NB of the master latch circuit interconnects the output terminal of the inverter 103 and the input terminal of the inverter 104.

A switching element SW2 includes a p-channel transistor 105 and an n-channel transistor 106. The p-channel transistor 105 has a gate coupled to the signal line for clock signal xclk, and source and drain coupled to data holding nodes NB and NC. The n-channel transistor 106 has a gate coupled to the signal line for clock signal clk, and source and drain coupled to the data holding nodes NB and NC. The switching elements SW1 and SW2 perform their respective ON-OFF operations in reverse.

An inverter 107 has an input terminal coupled to the data holding node NC, and an output terminal coupled to a data holding node ND. An inverter 108 has an input terminal coupled to the data holding node ND, and an output terminal coupled to the data holding node NC. The inverters 107 and 108 function as a slave latch circuit. The data holding node NC of the slave latch circuit interconnects the input terminal of the inverter 107 and the output terminal of the inverter 108. The data holding node ND of the slave latch circuit interconnects the output terminal of the inverter 107 and the input terminal of the inverter 108.

A switching element SW3 is coupled between the data holding nodes NA and ND. An inverter 109 has an input terminal coupled to the data holding node ND, and an output terminal coupled to a data output terminal Dout.

Figure 2B:
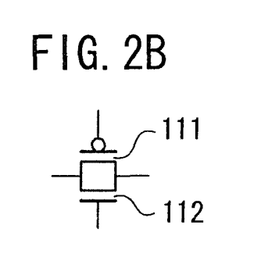

FIG. 2B is a circuit diagram showing an exemplary configuration of the switching element SW3 shown in FIG. 2A. The switching element SW3 includes transistors 111 and 112 and is called a "transmission gate". The source and drain of the p-channel transistor 111 are coupled to the data holding nodes NA and ND. The drain and source of the n-channel transistor 112 are coupled to the data holding nodes NA and ND. The ON-OFF operations of the switching element SW3 are controlled by controlling the gate voltages of the respective transistors 111 and 112.

Figure 2C:
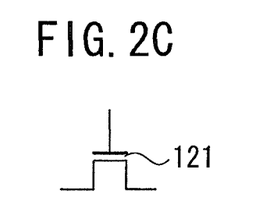

FIG. 2C is a circuit diagram showing another exemplary configuration of the switching element SW3 shown in FIG. 2A. The switching element SW3 has a transistor 121. The drain and source of the n-channel transistor 121 are coupled to the data holding nodes NA and ND. The ON-OFF operations of the switching element SW3 are controlled by controlling the gate voltage of the transistor 121.

Figure 2D:
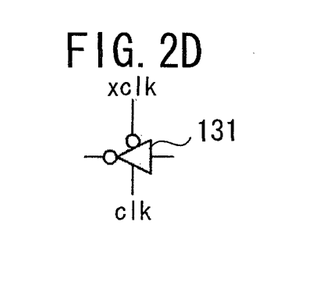

FIG. 2D is a circuit diagram showing yet another exemplary configuration of the switching element SW3 shown in FIG. 2A. The switching element SW3 has a clock gate 131. The clock gate 131 has clock terminals coupled to the signal lines for clock signals clk and xclk.

Figure 2E:
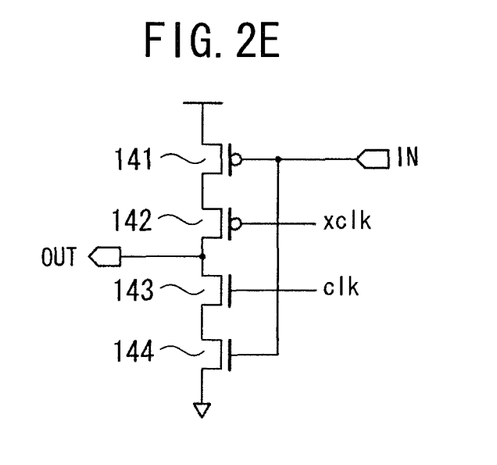

FIG. 2E is a circuit diagram showing an exemplary configuration of the clock gate 131 shown in FIG. 2D. A p-channel transistor 141 has a source coupled to a source voltage line, a gate coupled to an input terminal IN, and a drain coupled to the source of a p-channel transistor 142. The p-channel transistor 142 has a gate coupled to the signal line for clock signal xclk, and a drain coupled to an output terminal OUT. An n-channel transistor 143 has a drain coupled to the output terminal OUT, a gate coupled to the signal line for clock signal clk, and a source coupled to the drain of an n-channel transistor 144. The n-channel transistor 144 has a gate coupled to the input terminal IN, and a source coupled to a reference potential, for example, ground potential.

Figure 3A:
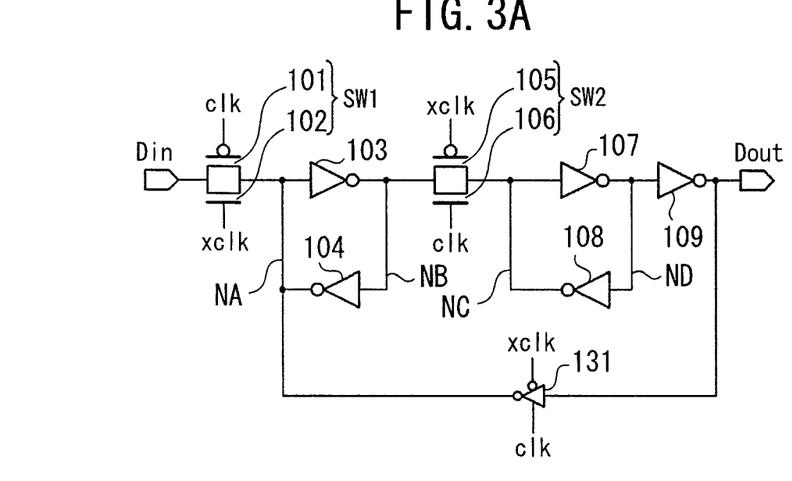
FIGS. 3A to 3C are diagrams illustrating a semiconductor device including a latch circuit according to a second embodiment.
Figure 3B:
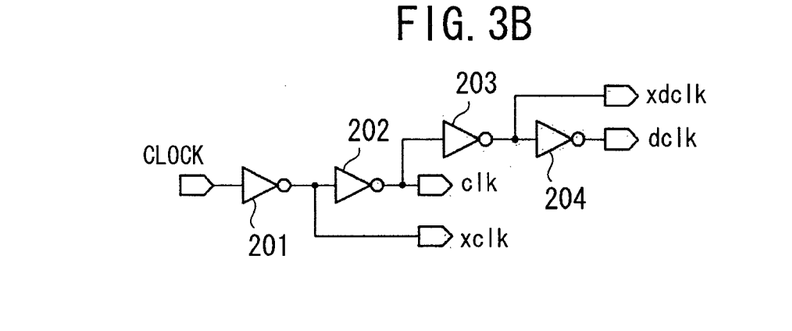
Figure 3C:
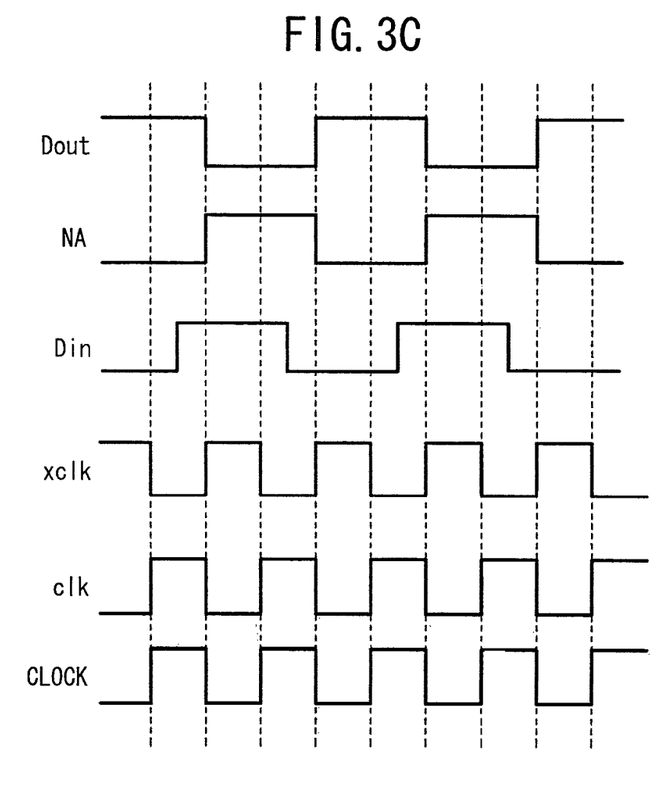

FIG. 3A shows a semiconductor device including a latch circuit according to a second embodiment. FIG. 3B shows an exemplary configuration of a clock generating circuit. FIG. 3C is a timing chart showing operations of the circuits shown in FIGS. 3A and 3B.

The semiconductor device shown in FIG. 3A uses the clock gate 131 shown in FIG. 2D as the switching element SW3. The clock gate 131 has the input terminal IN coupled to the data output terminal Dout, and the output terminal OUT coupled to the data holding node NA.

The clock generating circuit shown in FIG. 3B has inverters 201 to 204. The inverter 201 outputs the clock signal xclk which is inverted from a reference clock signal CLOCK. The inverter 202 outputs the clock signal clk which is inverted from the clock signal xclk. The clock signals clk and xclk are signals inverted from each other.

The inverter 203 outputs a clock signal xdclk which is inverted and delayed from the clock signal clk. The inverter 204 outputs a clock signal dclk which is inverted from the clock signal xdclk. The clock signals dclk and xdclk are signals inverted from each other and delayed relative to the clock signals clk and xclk.

When the logical value of the clock signal xclk is at high level while the logical value of the clock signal clk is at low level, the transistors 101 and 102 are turned ON to turn ON the switching element SW1, while the transistors 105 and 106 are turned OFF to turn OFF the switching element SW2. Also, the clock gate 131 turns OFF the transistors 142 and 143 shown in FIG. 2E, to make them assume a high impedance state relative to the output terminal OUT. In this state, data is written.

Conversely, when the logical value of the clock signal xclk is at low level while the logical value of the clock signal clk is at high level, the transistors 101 and 102 are turned OFF to turn OFF the switching element SW1, while the transistors 105 and 106 are turned ON to turn ON the switching element SW2. Also, the clock gate 131 turns ON the transistors 142 and 143 shown in FIG. 2E, so that the transistors 141 and 144 function as an inverter. In this case, the clock gate 131 inverts data received by the input terminal IN and outputs the data thus inverted to the output terminal OUT. In this state, data is held.

When the logical value of the clock signal xclk is at high level, the switching element SW1 is turned ON to interconnect the data input terminal Din and the data holding node NA. Thus, data at the data holding node NA takes on a value equal to the value of data at the data input terminal Din. The switching element SW2 is turned OFF to disconnect the data holding nodes NB and NC from each other. The clock gate 131 is turned OFF to disconnect the data holding node NA and the data output terminal Dout from each other.

When the logical value of the clock signal xclk is at low level, the switching element SW1 is turned OFF to disconnect the data input terminal Din and the data holding node NA from each other. Thus, even when data at the data input terminal Din changes, the data at the data holding node NA is held as it is. The inverter 103 inverts the data held at the data holding node NA and then outputs the data thus inverted to the data holding node NB. The inverter 104 inverts the data held at the data holding node NB and then outputs the data thus inverted to the data holding node NA. The inverters 103 and 104 function as a master latch circuit to hold the data at the data holding nodes NA and NB.

Also, when the logical value of the clock signal xclk is at low level, the switching element SW2 is turned ON to interconnect the data holding nodes NB and NC. Thus, data at the data holding node NC takes on a value equal to the value of data at the data holding node NB. The inverter 107 inverts data held at the data holding node NC and then outputs the data thus inverted to the data holding node ND. The inverter 108 inverts the data held at the data holding node ND and then outputs the data thus inverted to the data holding node NC. The inverters 107 and 108 function as a slave latch circuit to hold the data at the data holding nodes NC and ND.

The inverter 109 inverts the data held at the data holding node ND and then outputs the data thus inverted to the data output terminal Dout. The data at the data output terminal Dout is inverted from the data at the data holding node NA.

Also, when the logical value of the clock signal xclk is at low level, the clock gate 131 is turned ON. The clock gate 131 inverts the data at the data output terminal Dout and outputs the data thus inverted to the data holding node NA. Thus, the data holding by the data holding node NA is supplemented by the output from the clock gate 131, whereby the occurrence of the soft error is suppressed.

It should be noted that instead of the clock signals clk and xclk, delayed clock signals dclk and xdclk may be inputted to the clock terminals of the clock gate 131. The clock signals dclk and xdclk are delayed by delay time Td relative to the clock signals clk and xclk, respectively. The delay time Td is preferably more than 0 and not less than a value ½ as large as the cycle time of the clock signal clk. The switching element SW3 is ON during at least a part of a period during which the switching element SW2 is ON. This feature enables the switching element SW3 to be switched from OFF to ON after a wait of the delay time Td which is the time required for data in the master latch circuit to be written to the slave latch after the switching element SW2 has been switched from OFF to ON, thereby making it possible to stabilize the operation of the semiconductor device.

As described above, the clock gate 131 coupled to the data holding node NA of the master latch circuit is OFF during a data writing period for the master latch circuit, i.e., the period during which the logical value of the clock signal xclk is at high level. Accordingly, the data holding node NA of the mater latch circuit and the date output terminal Dout are not electrically coupled to each other during the data writing period. Thus, degradations in the performance of the latch circuit, for example, the setup time, are suppressed during the data writing period.

The clock gate 131 coupled to the data holding node NA of the master latch circuit is ON during a data holding period for the master latch circuit, i.e., the period during which the logical value of the clock signal xclk is at low level. Accordingly, the data holding node NA of the mater latch circuit and the date output terminal Dout are electrically coupled to each other during the data holding period. Thus, electric signals are fed to the data holding node NA of the master latch circuit from the clock gate 131 and the data output terminal Dout. Thus, even when the potential of the data holding node NA of the master latch circuit is varied temporarily by radiation such as alpha ray, data is rewritten into correct data by the electric signals from the data output terminal Dout and the clock gate 131, whereby the occurrence of the soft error is suppressed.

Figure 4:
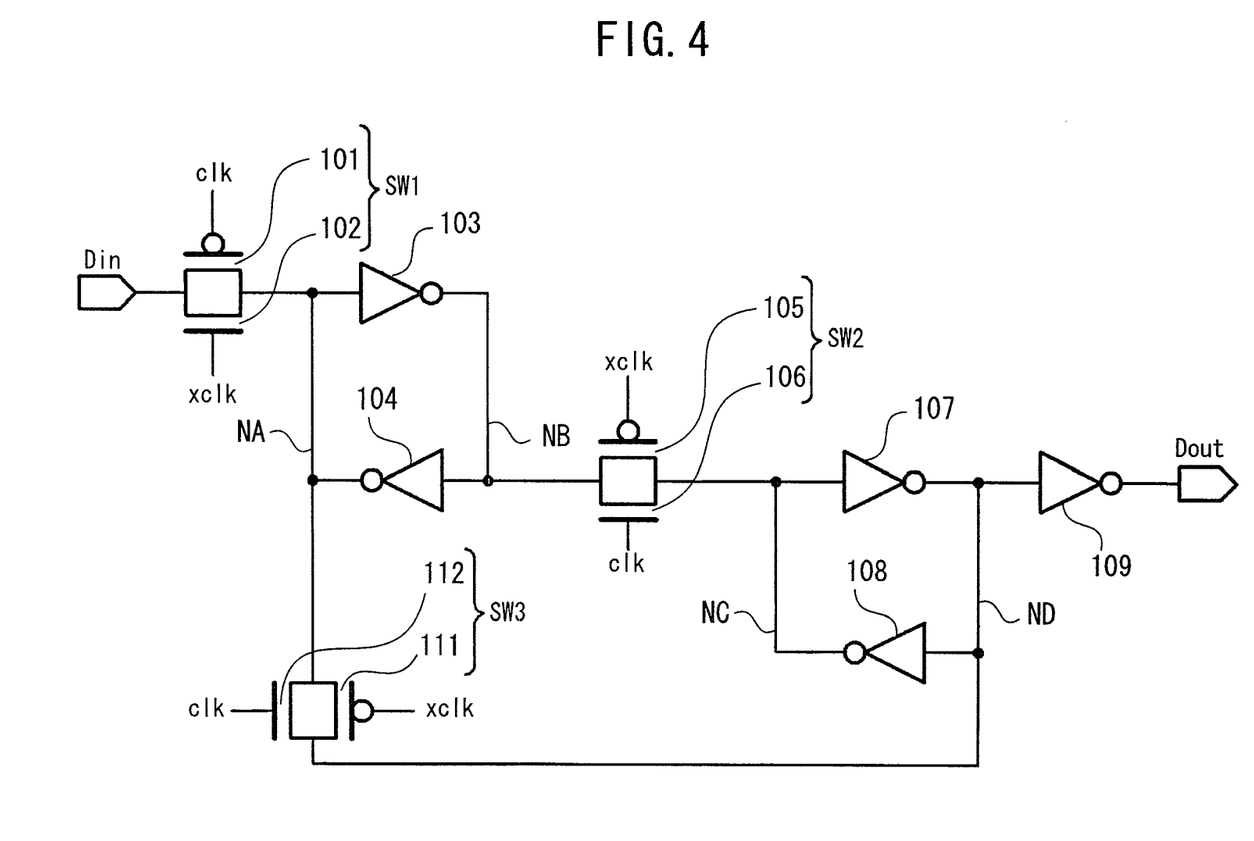
FIG. 4 is a circuit diagram showing a semiconductor device including a latch circuit according to a third embodiment.

FIG. 4 is a circuit diagram showing an exemplary configuration of a semiconductor device including a latch circuit according to a third embodiment. The semiconductor device shown uses the transistors 111 and 112 shown in FIG. 2B as the switching element SW3. The p-channel transistor 111 has a gate coupled to the signal line for clock signal xclk, and source and drain coupled to the data holding nodes NA and ND. The n-channel transistor 112 has a gate coupled to the signal line for clock signal clk, and drain and source coupled to the data holding nodes NA and ND.

The switching element SW3 including the transistors 111 and 112 does not have any data inverting function and hence is coupled not to the data output terminal Dout but to the data holding node ND. During the data writing period during which the logical value of the clock signal xclk is at high level, the switching element SW3 is OFF. During the data holding period during which the logical value of the clock signal xclk is at low level, the switching element SW3 is ON. During the data holding period, the switching element SW3 is ON and outputs data held at the data holding node ND to the data holding node NA. Since the data holding nodes NA and ND hold the same logical data, the data at the data holding node NA is supplemented by electric signals fed from the data holding node ND, whereby the occurrence of the soft error is suppressed. Since the present embodiment uses the transistors 111 and 112 to form the switching element SW3, the area of the switching element SW3 is reduced as compared with the second embodiment using the clock gate 131.

Figure 5:
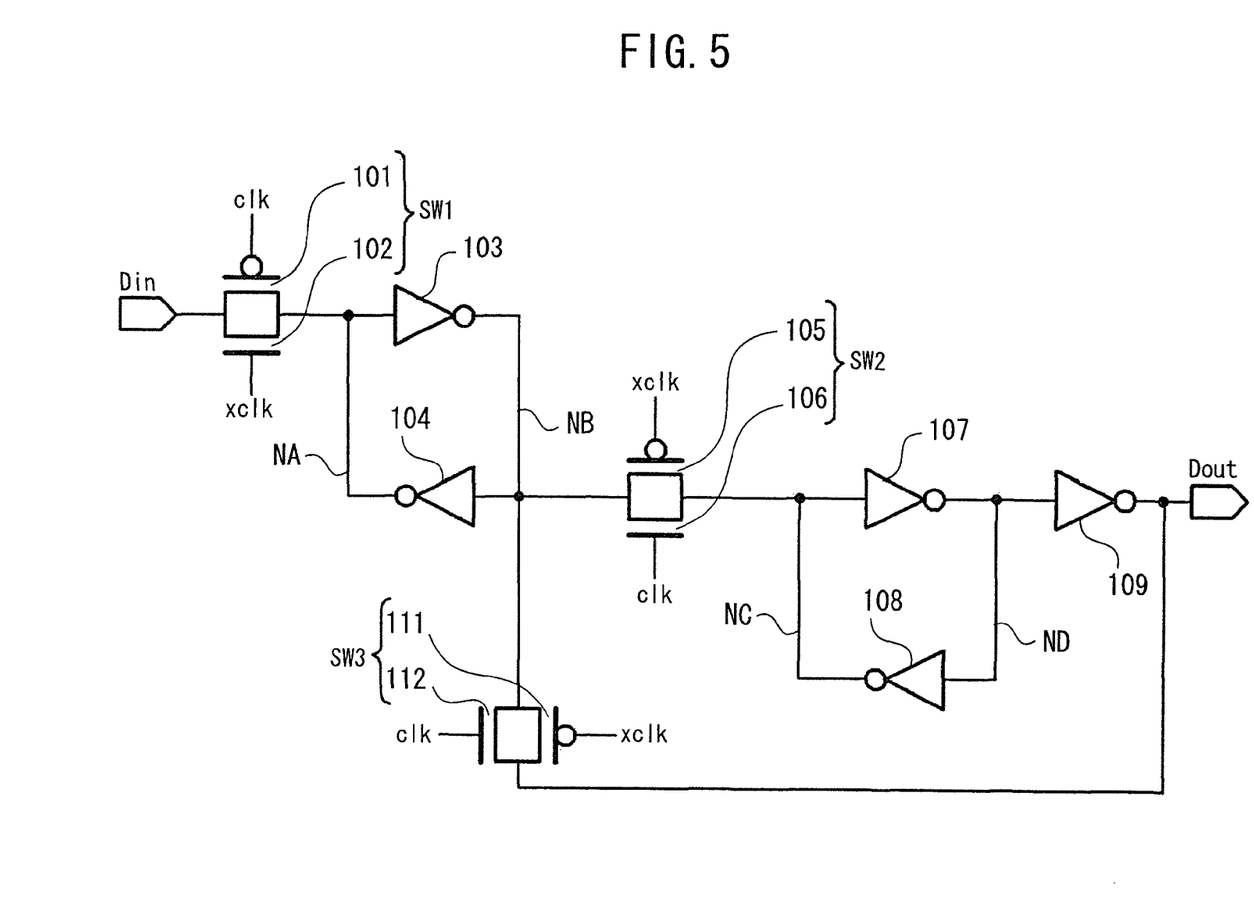
FIG. 5 is a circuit diagram showing a semiconductor device including a latch circuit according to a fourth embodiment.

FIG. 5 shows a semiconductor device including a latch circuit according to a fourth embodiment. The switching element SW3 is coupled between the data holding node NB and the data output terminal Dout. That is, the source and drain of each of the transistors 111 and 112 are coupled to the data holding node NB and the data output terminal Dout. During the data holding period, the switching element SW3 is ON to interconnect the data holding node NB and the data output terminal Dout. Since the data holding node NB is fed with electric signals from the data output terminal Dout, the occurrence of the soft error is suppressed.

Figure 6:
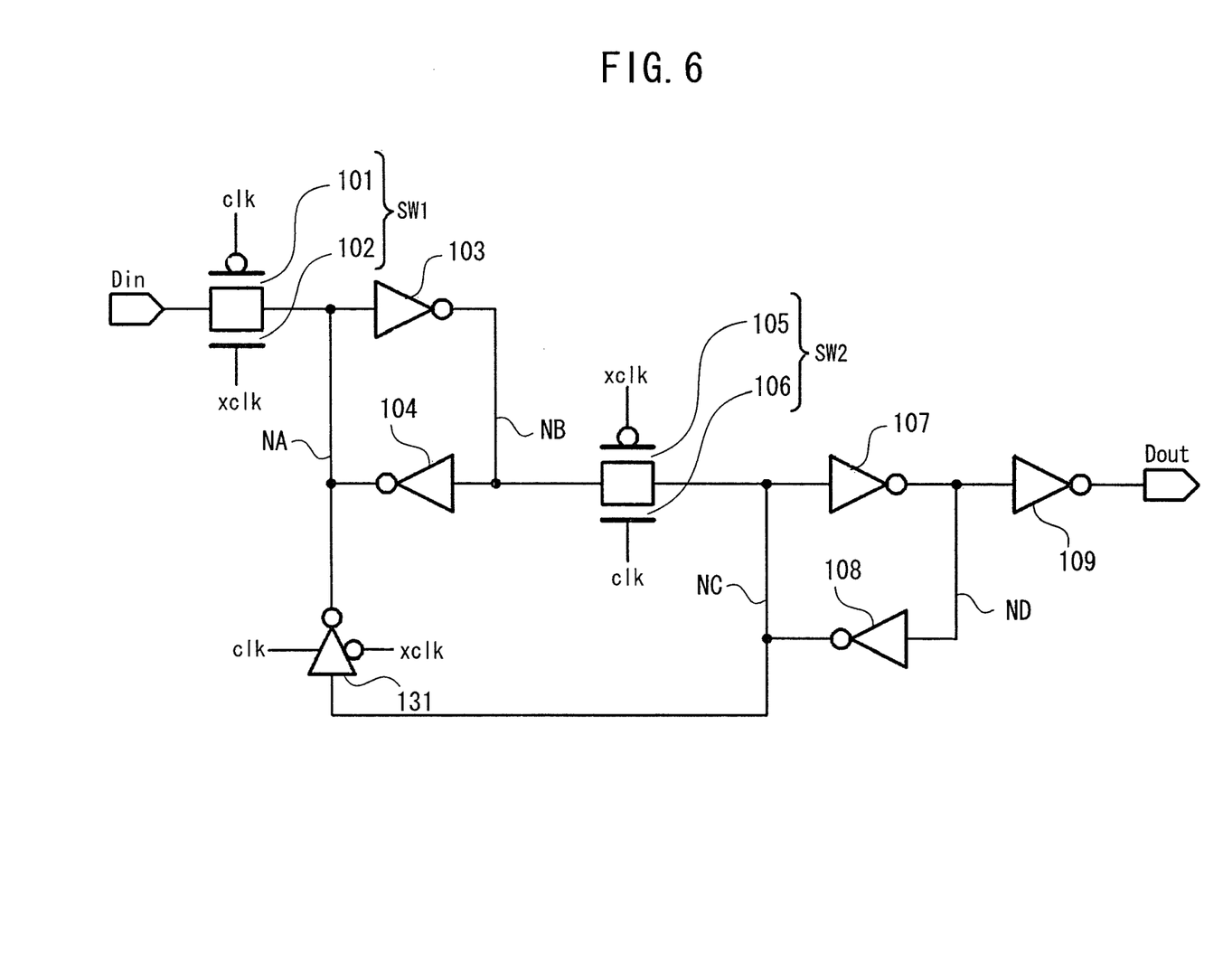
FIG. 6 is a circuit diagram showing a semiconductor device including a latch circuit according to a fifth embodiment.

FIG. 6 shows a semiconductor device including a latch circuit according to a fifth embodiment. The clock gate 131 has an input terminal coupled to the data holding node NC, and an output terminal coupled to the data holding node NA. During the data holding period, the clock gate 131 is ON and inverts data held at the data holding node NC and then outputs the data thus inverted to the data holding node NA. Since the data holding node NA is fed with electric signals from the data holding node NC and the clock gate 131, the occurrence of the soft error is suppressed. The clock gate 131 has an amplification function and hence can exhibit an enhanced soft error preventive effect as compared with the switching element SW3 including the transistors 111 and 112.

Figure 7:
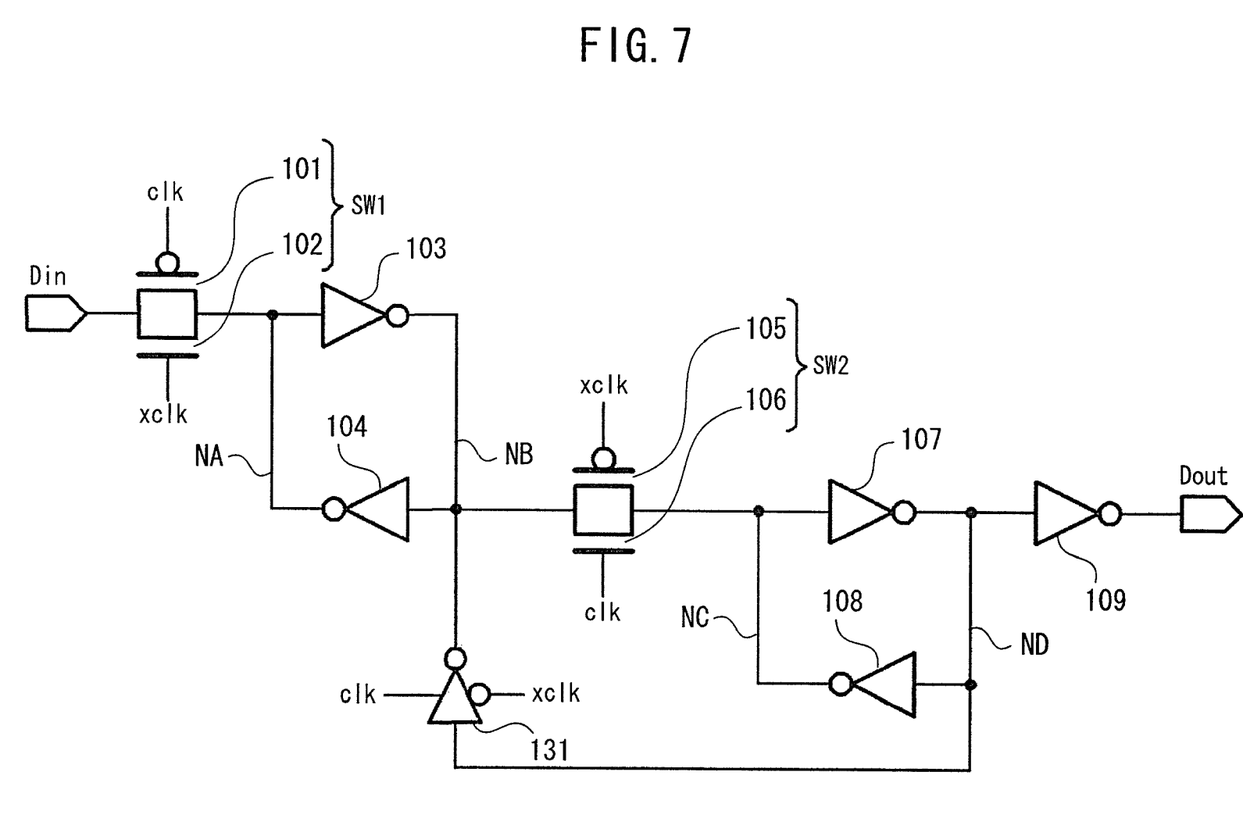
FIG. 7 is a circuit diagram showing a semiconductor device including a latch circuit according to a sixth embodiment.

FIG. 7 shows a semiconductor device including a latch circuit according to a sixth embodiment. The clock gate 131 has an input terminal coupled to the data holding node ND, and an output terminal coupled to the data holding node NB. During the data holding period, the clock gate 131 is ON and inverts data held at the data holding node ND and then outputs the data thus inverted to the data holding node NB. Since the data holding node NB is fed with electric signals from the data holding node ND and the clock gate 131, the occurrence of the soft error is suppressed.

Figure 8:
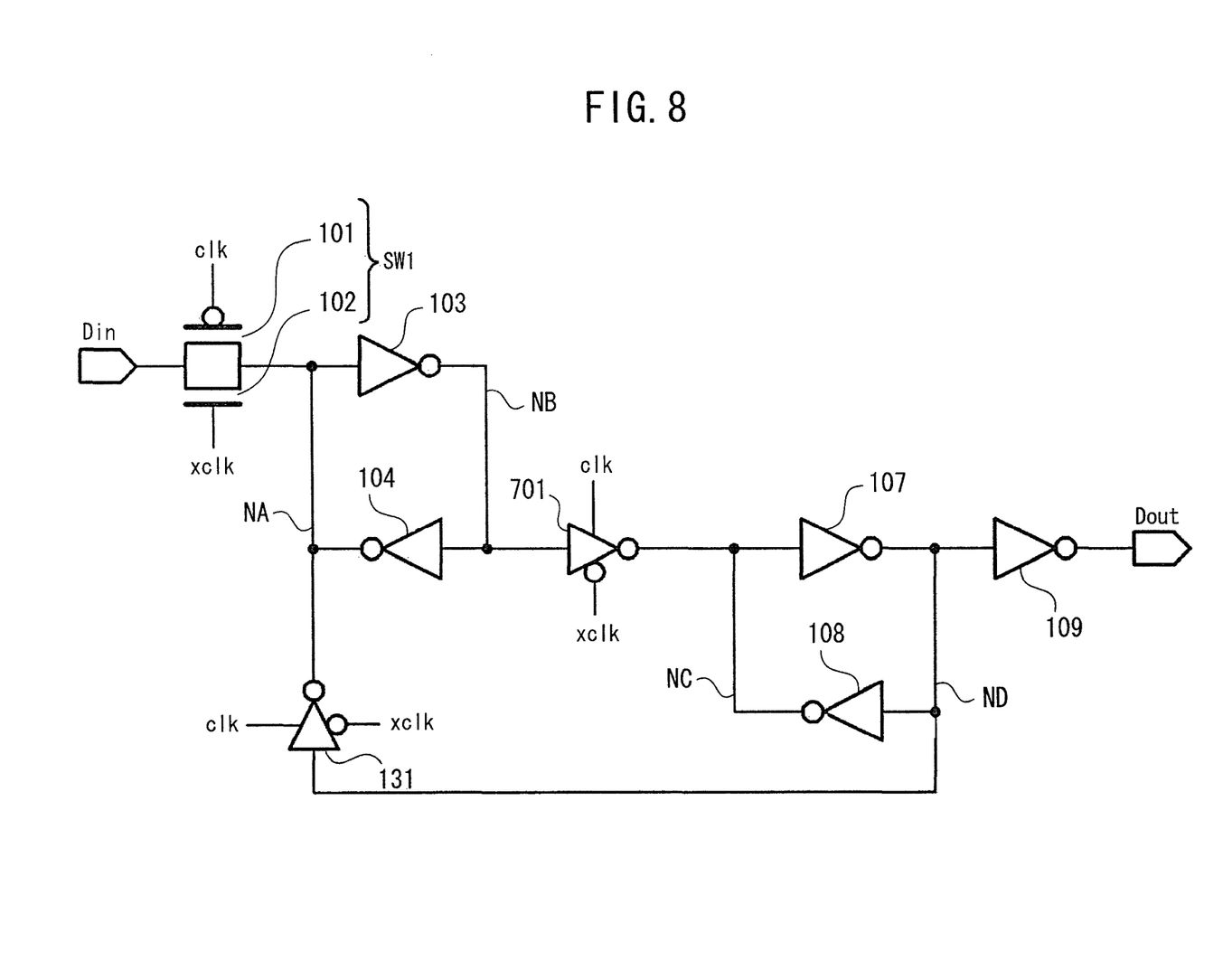
FIG. 8 is a circuit diagram showing a semiconductor device including a latch circuit according to a seventh embodiment.

FIG. 8 shows a semiconductor device including a latch circuit according to a seventh embodiment. A clock gate 701 has an input terminal coupled to the data holding node NB, and an output terminal coupled to the data holding node NC. The clock gate 131, which is equivalent to the switching element SW3, has an input terminal coupled to the data holding node ND, and an output terminal coupled to the data holding node NA. During the data holding period, the clock gate 701 is ON and inverts data held at the data holding node NB and then outputs the data thus inverted to the data holding node NC. Also, the clock gate 131 is ON and inverts data held at the data holding node ND and then outputs the data thus inverted to the data holding node NA. Since the data holding node NA is fed with electric signals from the data holding node ND and the clock gate 131, the occurrence of the soft error is suppressed.

Figure 9:
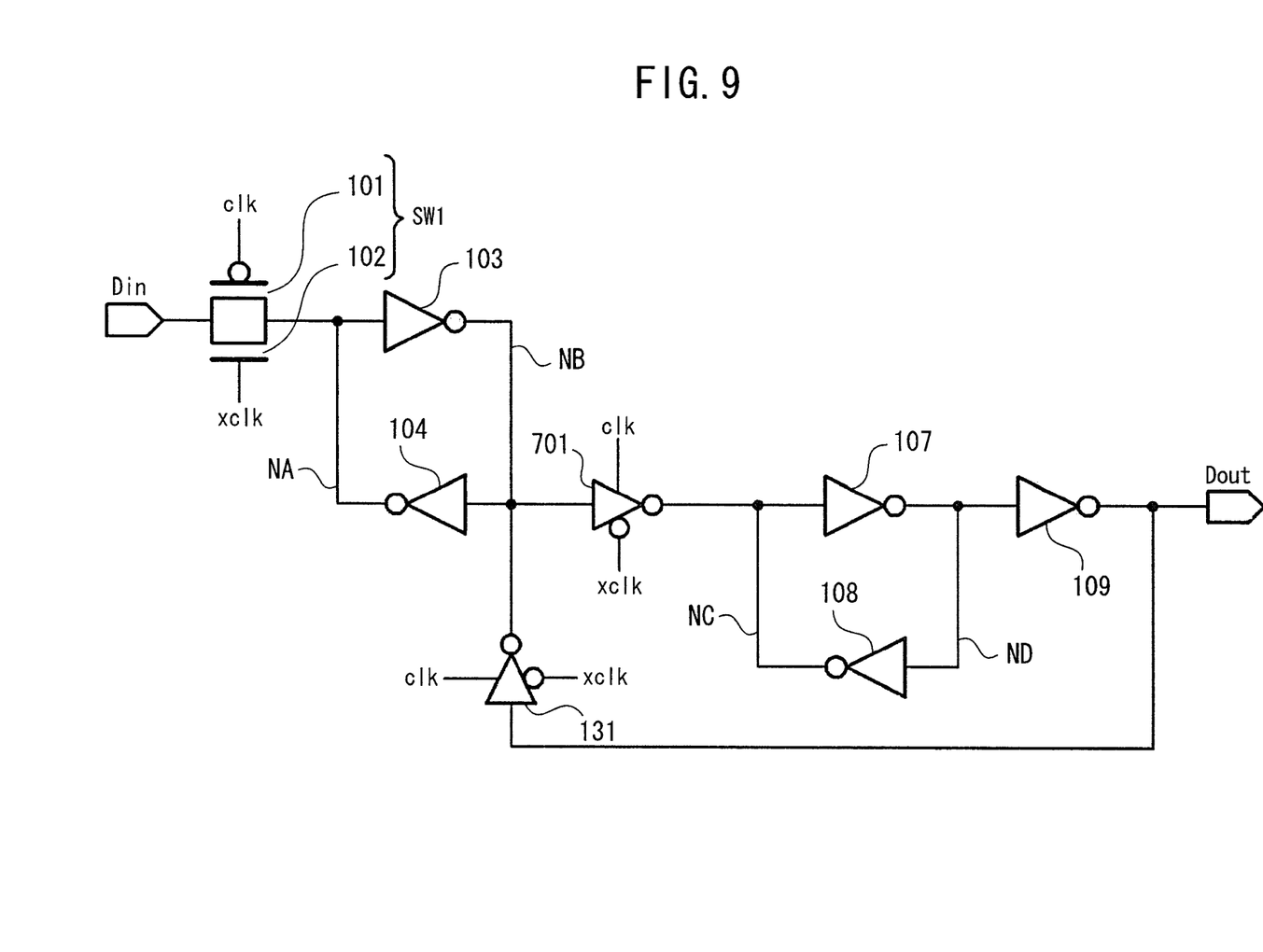
FIG. 9 is a circuit diagram showing a semiconductor device including a latch circuit according to an eighth embodiment.

FIG. 9 shows a semiconductor device including a latch circuit according to an eighth embodiment. The clock gate 131 has an input terminal coupled to the data output terminal Dout, and an output terminal coupled to the data holding node NB. During the data holding period, the clock gate 131 is ON and inverts data at the data output terminal Dout and then outputs the data thus inverted to the data holding node NB. Since the data holding node NB is fed with electric signals from the data output terminal Dout and the clock gate 131, the occurrence of the soft error is suppressed.

Figure 10:
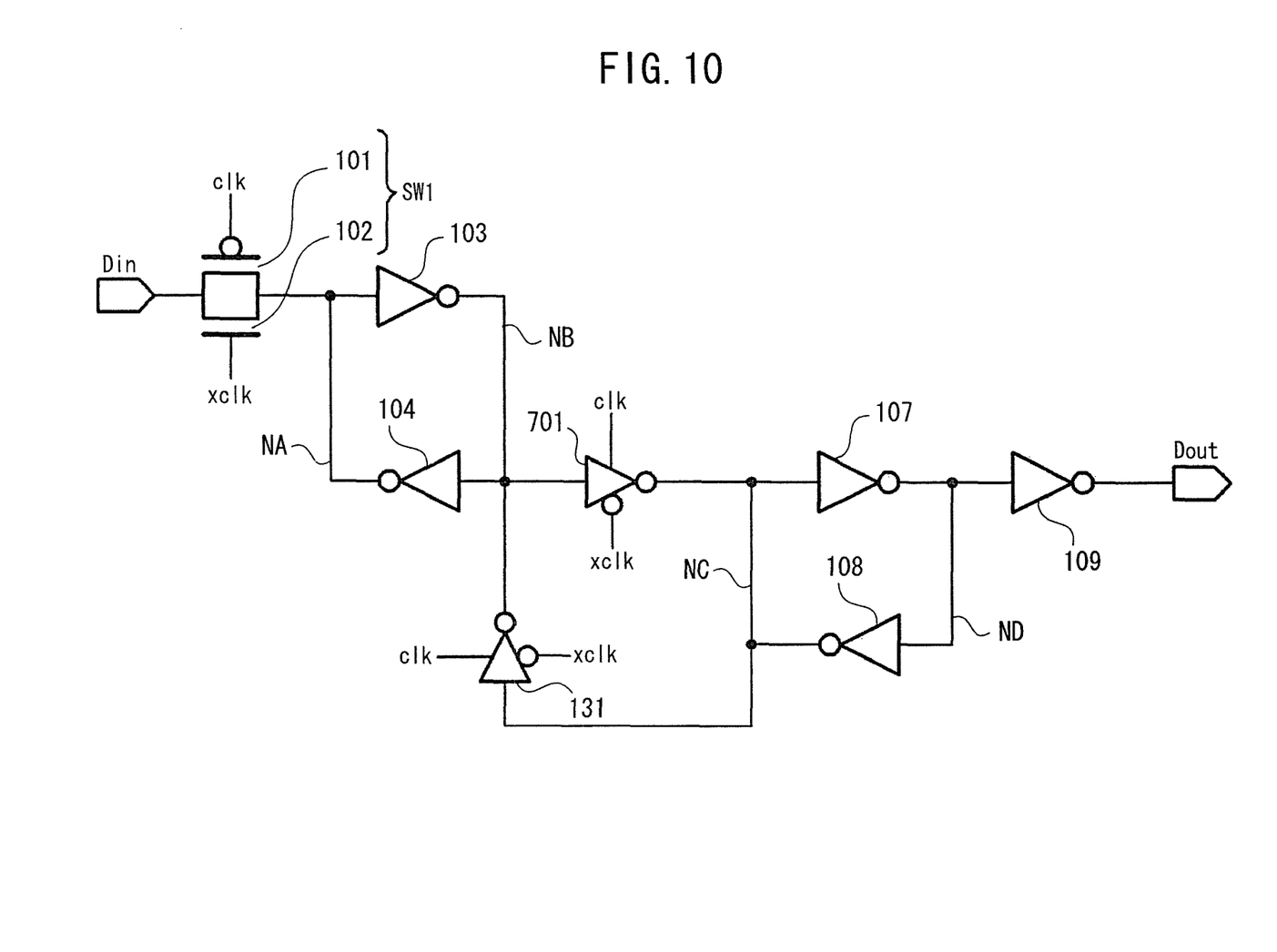
FIG. 10 is a circuit diagram showing a semiconductor device including a latch circuit according to a ninth embodiment.

FIG. 10 shows a semiconductor device including a latch circuit according to a ninth embodiment. The clock gate 131 has an input terminal coupled to the data holding node NC, and an output terminal coupled to the data holding node NB. During the data holding period, the clock gate 131 is ON and inverts data held at the data holding node NC and then outputs the data thus inverted to the data holding node NB. Since the data holding node NB is fed with electric signals from the data holding node NC and the clock gate 131, the occurrence of the soft error is suppressed.

Figure 11:
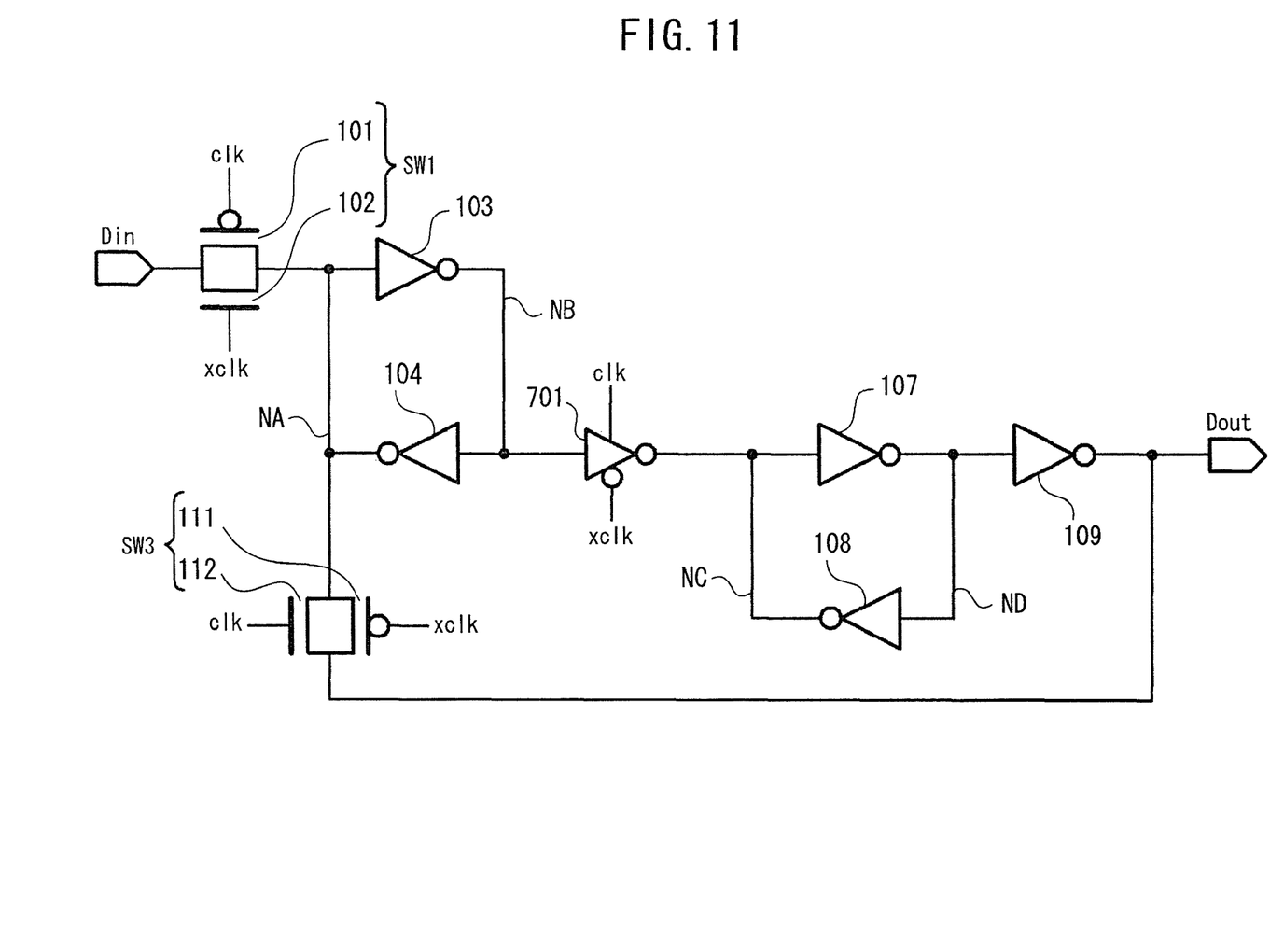
FIG. 11 is a circuit diagram showing a semiconductor device including a latch circuit according to a tenth embodiment.

FIG. 11 shows a semiconductor device including a latch circuit according to a tenth embodiment. The switching element SW3 is coupled between the data holding node NA and the data output terminal Dout. That is, the p-channel transistor 111 has a gate coupled to the signal line for clock signal xclk, and source and drain coupled to the data holding node NA and the data output terminal Dout. The n-channel transistor 112 has a gate coupled to the signal line for clock signal clk, and drain and source coupled to the data holding node NA and the data output terminal Dout. During the data holding period, the switching element SW3 is ON and outputs data at the data output terminal Dout to the data holding node NA. Since the data holding node NA is fed with electric signals from the data output terminal Dout, the occurrence of the soft error is suppressed.

Figure 12:
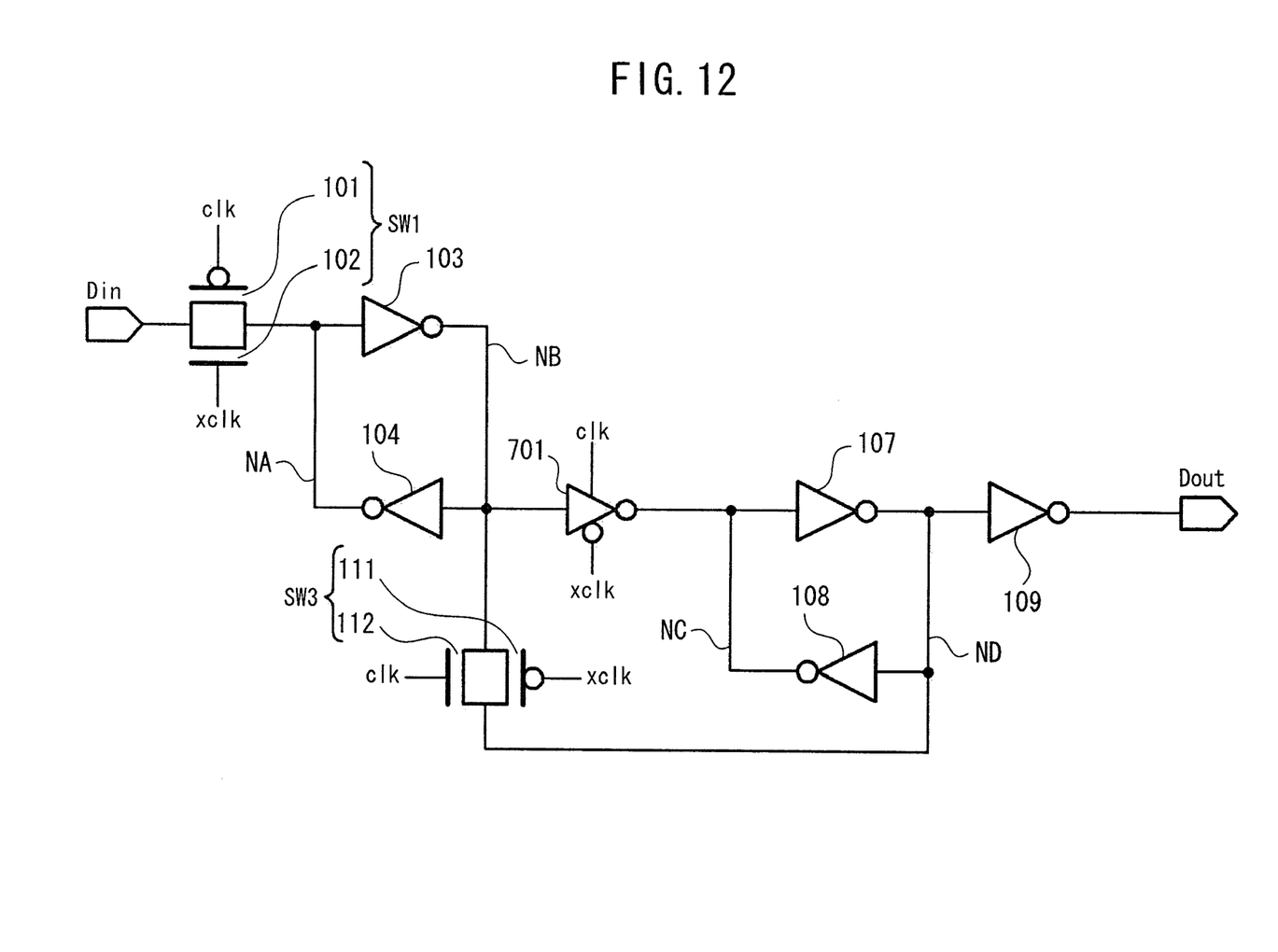
FIG. 12 is a circuit diagram showing a semiconductor device including a latch circuit according to an eleventh embodiment.

FIG. 12 shows a semiconductor device including a latch circuit according to an eleventh embodiment. The switching element SW3 is coupled between the data holding nodes NB and ND. That is, the source and drain of each of the transistors 111 and 112 are coupled to the data holding nodes NB and ND. During the data holding period, the switching element SW3 is ON and outputs data held at the data holding node ND to the data holding node NB. Since the data holding node NB is fed with electric signals from the data holding node ND, the occurrence of the soft error is suppressed.

As described above, any one of the semiconductor devices according to the first to eleventh embodiments includes the first latch circuit including the inverters 103 and 104, the second latch circuit including the inverters 107 and 108 and configured to hold an output of the first latch circuit, the first switching element SW2 provided between the first and second latch circuits, the feedback line for feeding data held by the second latch circuit to the first latch circuit, and the second switching element SW3 provided on the feedback line.

The semiconductor device may further include the third switching element SW1. The third switching element is provided on the input line of the first latch circuit. The clock generating circuit controls the first switching element SW2, second switching element SW3 and third switching element SW1.

The second switching element is ON during at least a part of the period during which the third switching element SW1 is OFF. For example, the clock signals dclk and xdclk are inputted to the clock terminals of the clock gate 131. Alternatively, the second switching element SW3 is ON during at least a part of the period during which the first switching element SW2 is ON.

Preferably, the second switching element SW3 performs ON-OFF operations in synchronization with the first switching element SW2. The third switching element SW1 performs ON-OFF operations in reverse of ON-OFF operations of the second switching element SW3.

The first latch circuit has a loop circuit including the plurality of inverters 103 and 104. The second latch circuit has a loop circuit including the plurality of inverters 107 and 108.

As described above, when the second switching element SW3 is turned ON, a feedback circuit from the second latch circuit to the first latch circuit is formed, so that the data holding by the first latch circuit is supplemented by the second latch circuit, thus making it possible to suppress the occurrence of the soft error.

What is claimed is:

1. A semiconductor device comprising:
a first latch circuit;
a second latch circuit coupled to the first latch circuit, and for receiving an output of the first latch circuit;
a first switching element provided between the first latch circuit and the second latch circuit;
a feedback line for feeding data held by the second latch circuit to the first latch circuit;
a second switching element provided on the feedback line;
an input line coupled to the first latch circuit;
a third switching element provided on the input line; and
a clock generating circuit for controlling operations of the first switching element, the second switching element, and the third switching element,
wherein the second switching element is in an ON state during at least a part of a period during which the third switching element is in an OFF state,
wherein the second switching element is in the OFF state during a part of a period during which the first switching element is in the ON state,
wherein the clock generating circuit generates a first clock signal to be supplied to the first switch element and generates a second clock signal to be supplied to the second switch element by delaying the first clock signal by a certain delay.

2. The semiconductor device according to claim 1, wherein the second switching element changes from the OFF state to the ON state after a certain delay time elapses from when the first switching element becomes the ON state.

3. A semiconductor device comprising:
a first latch circuit;
a second latch circuit;
a first transmission line for transmitting an output of the first latch circuit to the second latch circuit;
a second transmission line for transmitting an output of the second latch circuit to the first latch circuit;
a first switching element provided on the first transmission line;
a second switching element provided on the second transmission line;
an input line coupled to the first latch circuit;
a third switching element provided on the input line; and
a clock generating circuit for controlling operations of the first switching element, the second switching element, and the third switching element,
wherein the second switching element is in an ON state during at least a part of a period during which the third switching element is in an OFF state,
wherein the second switching element is in the OFF state during a part of a period during which the first switching element is in the ON state,
wherein the clock generating circuit generates a first clock signal to be supplied to the first switch element and generates a second clock signal to be supplied to the second switch element by delaying the first clock signal by a certain delay.

4. The semiconductor device according to claim 3, wherein the second switching element changes from the OFF state to the ON state after a certain delay time elapses from when the first switching element becomes the ON state.

* * * * *